United States Patent
Teh et al.

(10) Patent No.: US 7,552,408 B2
(45) Date of Patent: **\*Jun. 23, 2009**

(54) METHOD FOR PERFORMING DESIGN RULE CHECK ON MASK PATTERN DATA FOR AN INTEGRATED CIRCUIT

(75) Inventors: Cheehoe Teh, Sunnyvale, CA (US); Nimcho Lam, Saratoga, CA (US); Mau Truong, Milpitas, CA (US)

(73) Assignee: United Microelectronics Corporation, Hsinchu (TW)

( * ) Notice: Subject to any disclaimer, the term of this patent is extended or adjusted under 35 U.S.C. 154(b) by 685 days.

This patent is subject to a terminal disclaimer.

(21) Appl. No.: 10/982,650

(22) Filed: Nov. 5, 2004

(65) Prior Publication Data

US 2005/0086619 A1  Apr. 21, 2005

Related U.S. Application Data (63) Continuation of application No. 10/101,648, filed on Mar. 20, 2002, now Pat. No. 6,816,997.

(60) Provisional application No. 60/278,672, filed on Mar. 20, 2001.

(51) Int. Cl.
*G06F 17/50* (2006.01)

(52) U.S. Cl. ............................. 716/5; 716/19

(58) Field of Classification Search ............. 716/5, 716/1, 10, 16, 19
See application file for complete search history.

(56) References Cited

U.S. PATENT DOCUMENTS

| | | | |
|---|---|---|---|
| 5,225,993 A * | 7/1993 | Iwatsuki et al. ............. 716/5 |
| 5,442,714 A * | 8/1995 | Iguchi ..................... 382/144 |
| 5,470,489 A * | 11/1995 | Felder et al. ............... 210/788 |
| 5,590,049 A * | 12/1996 | Arora ........................... 716/5 |
| 5,691,913 A | 11/1997 | Tsuchida et al. |
| 5,706,295 A | 1/1998 | Suzuki |
| 6,055,366 A | 4/2000 | Le et al. |
| 6,063,132 A | 5/2000 | DeCamp et al. |
| 6,078,737 A | 6/2000 | Suzuki |
| 6,219,821 B1 | 4/2001 | Hagerman et al. |
| 6,226,781 B1 | 5/2001 | Nistler et al. |
| 6,228,539 B1 | 5/2001 | Wang et al. |

(Continued)

FOREIGN PATENT DOCUMENTS

WO  WO 99/14837  3/1999

(Continued)

OTHER PUBLICATIONS

Microsoft Press, "Computer Dictionary, Third Edition", 1997, Microsoft Press, pp. 255, 315, 332.

*Primary Examiner*—Stacy A Whitmore
(74) *Attorney, Agent, or Firm*—Winston Hsu (57) ABSTRACT

An improved system and method is disclosed for performing a design rule check on a proposed integrated circuit (IC) layout, and for creating customized design rule check command files. The individual layers of the IC (a system on chip—SOC) are separated into different regions having different kinds of features (i.e., memory or logic). Each different type of region is then analyzed in accordance with the customized design rule command file so that so-called "false errors" are eliminated. The invention thus improves, among other things, a development time for getting a design implemented in silicon.

22 Claims, 10 Drawing Sheets

U.S. PATENT DOCUMENTS

| | | |
|---|---|---|
| 6,343,370 B1 | 1/2002 | Taoka et al. |
| 6,378,110 B1 * | 4/2002 | Ho ................................. 716/5 |
| 2002/0007481 A1 | 1/2002 | Ono |
| 2002/0016952 A1 | 2/2002 | Chang et al. |
| 2002/0019729 A1 | 2/2002 | Chang et al. |

FOREIGN PATENT DOCUMENTS

| | | |
|---|---|---|
| WO | WO 01/48793 A2 | 7/2001 |

* cited by examiner

Bordered SP SRAM bit cell against generic DRC command file

| Rule | Logic parameter | Pushed parameter |
|---|---|---|
| 4.1AB | 0.24um | 0.14um |
| 4.1C | 0.28um | 0.26um space, 0.11um notch |
| 4.1D.a | 0.43um | 0.38um |
| 4.1G.a | 0.43um | 0.20um |
| 4.8AaBaC | 0.18um | 0.08um |
| 4.8D.b1 | 0.34um | 0.02um |
| 4.8D.c2.1 | 0.24um | 0.24um (filter false gates, Not Acute) |
| 4.8D.c1 | 0.24um | 0.20um space, 0.09um notch |
| 4.8E | 0.22um | 0.01um |
| 4.8F | 0.10um | 0.02um |
| 4.8G | 0.12um | 0.12um (filter false endcaps) |
| 4.8H | 0.28um | 0.09um |
| 4.8J | | Filter false gates |
| 4.8N | 0.20um | 0.02um |
| 4. 12C.a | 0.15um | 0.08um |
| 4.12D | 0.18um | 0.17um |
| 4.12FG | 0.10um | 0.03um |
| 4.13D.bc | 0.08um | 0.04um |
| 4.14C.cd | 0.08um | 0.04um |

FIG. 7B

| Rule | Logic parameter | Pushed parameter |
|---|---|---|
| Drawn offgrid | Resolution 0.01um | Resolution 0.001um (not applied in current deck) |
| 4.1AB | 0.24um | 0.071um |
| 4.1C | 0.28um | 0.26um space, 0.11um notch |
| 4.1D.a | 0.43um | 0.38um |
| 4.1E | 0.24um | 0.23um |
| 4.1G.a | 0.43um | 0.20um |
| 4.8AaBaC | 0.18um | 0.09um |
| 4.8D.a1 | 0.28um | 0.23um |
| 4.8D.a2 | 0.32um | 0.23um |
| 4.8D.b1 | 0.34um | 0.22um |
| 4.8D.b2 | 0.34um | 0.259um (offgrid) |
| 4.8D.c1 | 0.24um | 0.156um space, 0.10um notch |
| 4.8D.c2.1 | 0.24um | 0.158um space, 0.10um notch |
| 4.8E | 0.22um | 0.02um |
| 4.8F | 0.10um | // 0um disabled |
| 4.8G | 0.12um | Filter with vertex == 4 |
| 4.8H | 0.28um | 0.02um |
| 4.8J |  | // EXT GATE1_W ...<br>// INT GATE1_W ... |
| 4.8N | 0.20um | 0.05um |
| 4.9C.a | 0.22um | 0.15um |
| 4.10D.a | 0.22um | 0.19um |
| 4.12A | 0.24umx0.24um | 0.05um min. width |
| 4.12B | 0.26um | 0.22um space, 0.10um notch |
| 4.12C.a | 0.15um | // 0um disabled |
| 4.12E | 0.10um | 0.031um |
| 4.12FG | 0.10um | // 0um disabled |
| 4.13A | 0.24um | 0.05um |
| 4.13B.a | 0.24um | 0.16um |
| 4.13D.ad |  | // (contact outside MET1) |
| 4.13D.bc | 0.08um | // 0um disabled |

FIG. 7C

DP SRAM bit cell against generic DRC command file

| Rule | Logic parameter | Pushed parameter |
|---|---|---|
| 4.1AB | 0.24um | 0.12um |
| 4.1C | 0.28um | 0.28um space, 0.12um notch |
| 4.1G.a | 0.43um | 0.3um |
| 4.8AaBac | 0.18um | 0.08um |
| 4.8D.c1 | 0.24um | 0.22um |
| 4.8E | 0.22um | 0.03um |
| 4.8F | 0.10um | 0.02um |
| 4.9C.a | 0.22um | 0.12um |
| 4.9C.b | 0.08um | 0.04um |
| 4.9D.b | 0.08um | 0.07um |
| 4.10C.b | 0.08um | 0.07um |
| 4.10D.a | 0.22um | 0.12um |
| 4.10D.b | 0.08um | 0.12um |
| 4.10M | | // PTAP ENC CNT |
| 4.12FG | 0.10um | 0.05um |
| 4.13A | 0.24um | 0.071um |
| 4.13B.a | 0.24um | 0.21um space, 0.20um notch |
| 4.13D.bc | 0.08um | 0.04um |

METHOD FOR PERFORMING DESIGN RULE CHECK ON MASK PATTERN DATA FOR AN INTEGRATED CIRCUIT

CROSS REFERENCE TO RELATED APPLICATIONS

The present application claims priority to and is a continuation of Ser. No. 10/101,648 filed Mar. 20, 2002, now U.S. Pat. No. 6,816,997 which is hereby incorporated by reference.

RELATED APPLICATION DATA

The present application claims priority from provisional application Ser. No. 60/278,672 filed Mar. 20, 2001, which is also incorporated by reference herein.

FIELD OF THE INVENTION

The present invention relates to the field of semiconductor design technology, and in particular, to systems and techniques used for implementing circuit designs into silicon based integrated circuits (ICs).

BACKGROUND

In the field of semiconductor design technology, a design rule check (DRC) is a well-known process for inspecting whether mask pattern data of a semiconductor integrated circuit is correctly designed in compliance with fabricators' topological layout rules (TLR). The TLR are unique to each fabrication facility, or semiconductor wafer plant, based on available process technologies, equipment limitations, etc. An example of prior art DRC system is illustrated in U.S. Pat. No. 6,063,132 incorporated by reference herein.

Integrated circuit designers transform circuit schematics to mask data by drawing polygons that represent the physical masks to be fabricated on silicon. For example, a transistor symbol on a circuit schematic could be represented by simply drawing a POLY layer polygon (gate region) crossing a DIFFUSION layer polygon (source and drain regions) and both polygons are laid within a WELL layer polygon. These mask pattern data are usually in well-known GDS format (binary) and are used by a design rule checker to check against design rules embodied in coded form in a design rule check command file.

Figure 1:
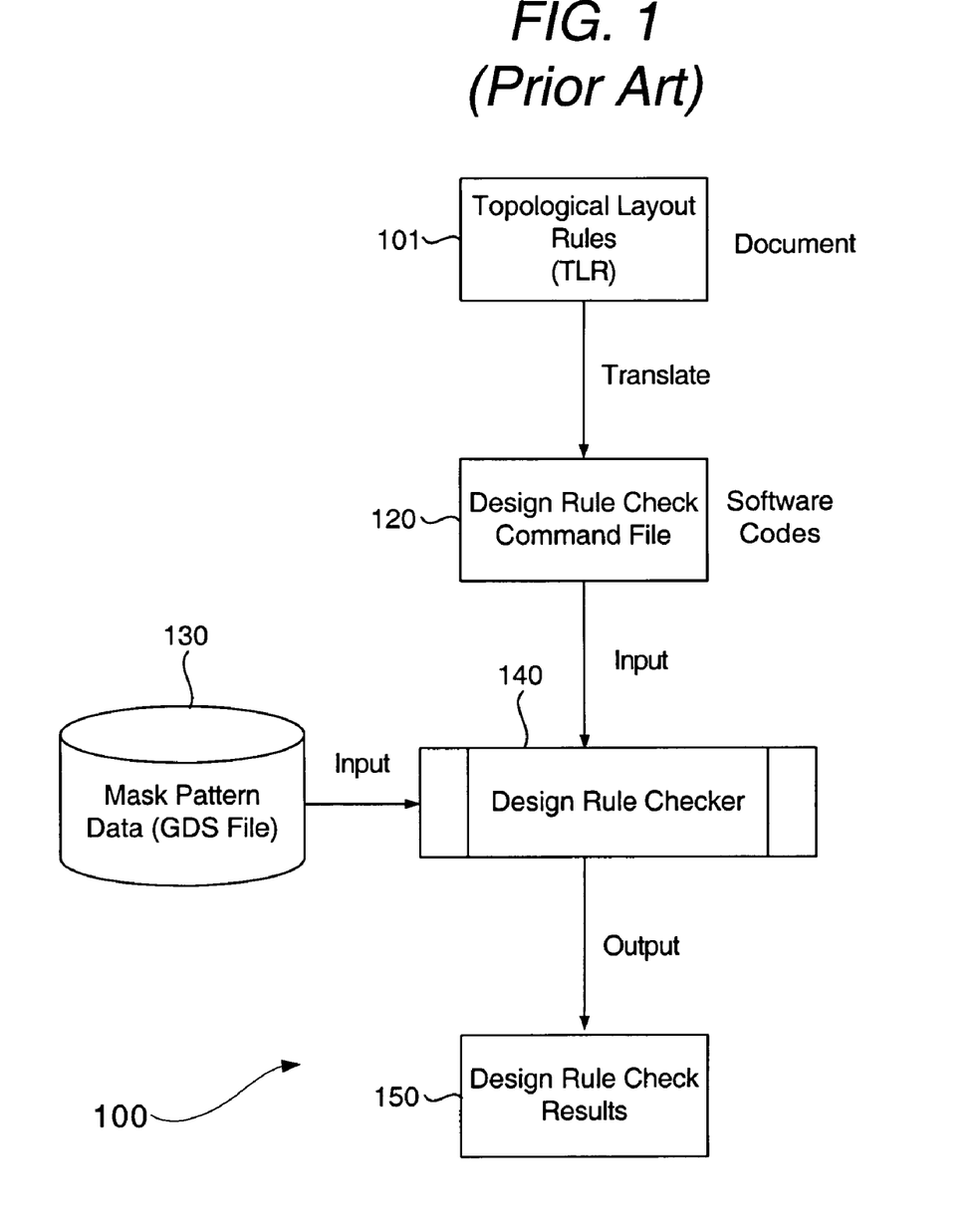
FIG. 1 illustrates a general prior art process flow sequence for performing design rule checking on mask pattern data of an integrated circuit.

FIG. 1 illustrates the basic flow of design rule checking on mask pattern data of an integrated circuit in accordance with a prior art routine 100. A design rule check (DRC) command file 120 is coded in accordance with a topological layout rule document 101. DRC command file 120 and the mask pattern data 130 (representing the physical layout of the IC) are used as inputs by a design rule checker 140 (typically a software routine) for design error detection and to generate a results list. Any subsequent design errors detected must be corrected in the layout proposed by the IC designer as shown in block 150. For some types of ICs, this process of checking the design errors can be automated, but for many others, it cannot.

A recent development in the IC industry has been the incorporation of memory and logic within the same IC, as found for example in embedded memory systems, and in so-called system-on-chip (SOC) designs. These systems present a unique challenge to the design process, because memory and logic circuits have different sizing, performance and scaling issues when embodied in silicon. Thus, logic and memory layout regions they must be treated differently during the verification process.

Figure 2:
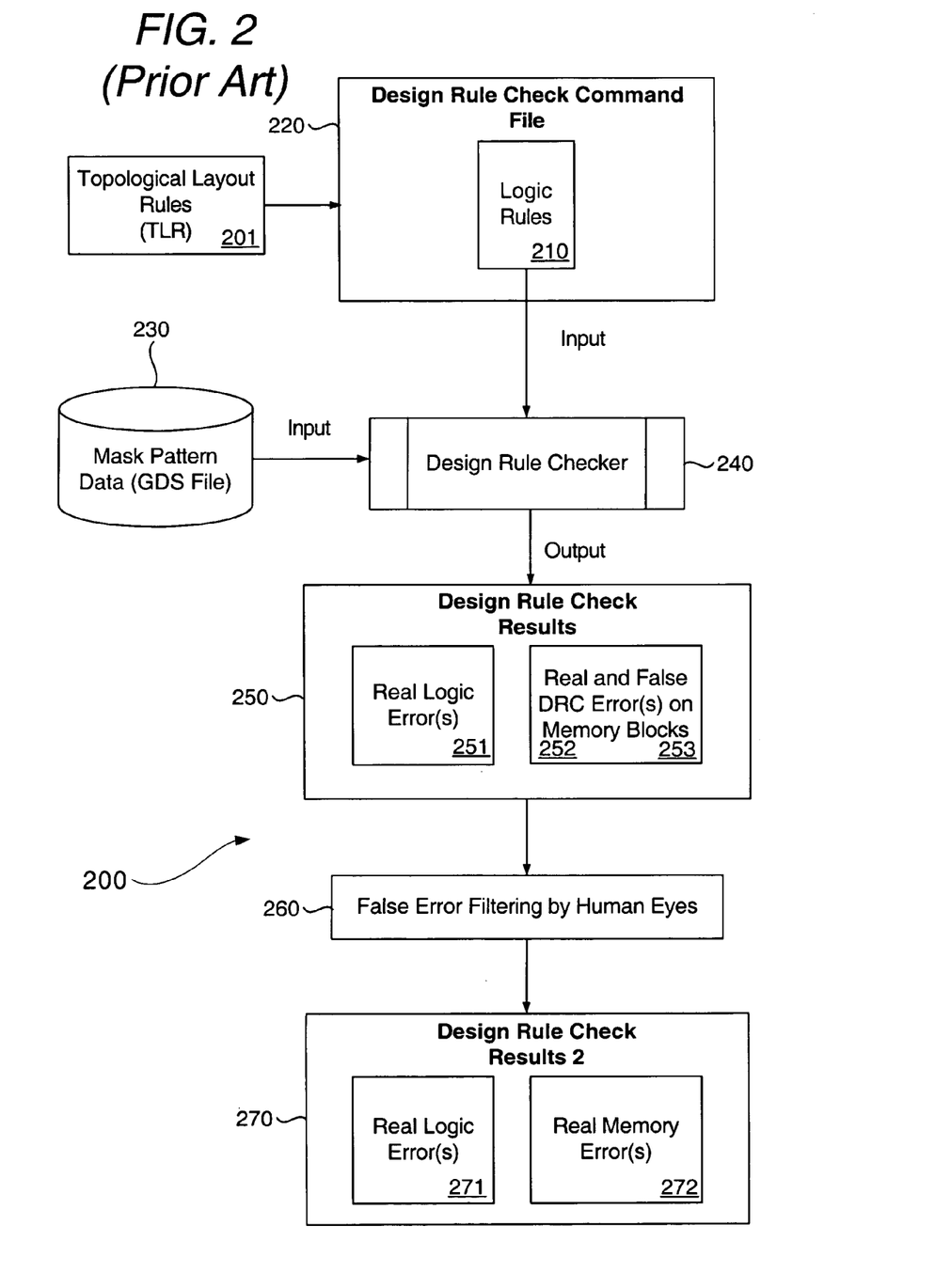
FIG. 2 illustrates a flow diagram of steps performed by a $1^{st}$ prior art method for real Logic and Memory errors detection.

A first conventional method of checking design rules for an SOC design is described now with reference to the system 200 shown in FIG. 2. In the case of a semiconductor foundry (i.e., those plants that specialize in rendering third party designs into silicon) a design rule check command file 220 is written by referring to a Foundry's Topological Layout Rule document (TLR) 201. Therefore, this design rule command file typically only consists of so-called "Logic Rules" 210 applicable to a logic section of a chip under consideration. As before the Mask Pattern Data 230 for the chip is fed into a design rule checker 240 to check against these logic rules. The output of this process is a design rule check result file 250.

At this point, the results consist of real logic error(s) 251, false logic rule errors on memory blocks 252 and possibly real memory error(s) 253. The false logic rule errors 252 are caused by the fact that logic circuits implemented in silicon typically require greater spacings, sizings and margins than memory circuits. An extra step 260 thus has to be carried out to filter false error(s) from the other real errors reported in the result database. The typical method is by manual effort—i.e., human eye review and filtering. This can be extremely time consuming and cumbersome since the number of false design rule errors will increase relative to the number of memory blocks used and the size of each memory instance.

Thus, this approach flags many false DRC errors because each memory bit cells and associated leaf cells can cause many DRC violations that are not "true" because they do not actually violate a memory design rule that is applicable to the memory block. An operator has to manually check all the violations against a memory design rule check at step 270 to see if they are real errors. They then iteratively repeat this process to arrive at a set of real logic errors 271, and real memory errors 272. Nonetheless, this process can often cause real errors to be overlooked. Furthermore, this process slows down the design development cycle because each error must be discussed with the IC design supplier, and this interaction can be time consuming as it requires cooperation between the IC designer, the foundry field support engineers, and the foundry itself.

Figure 3:
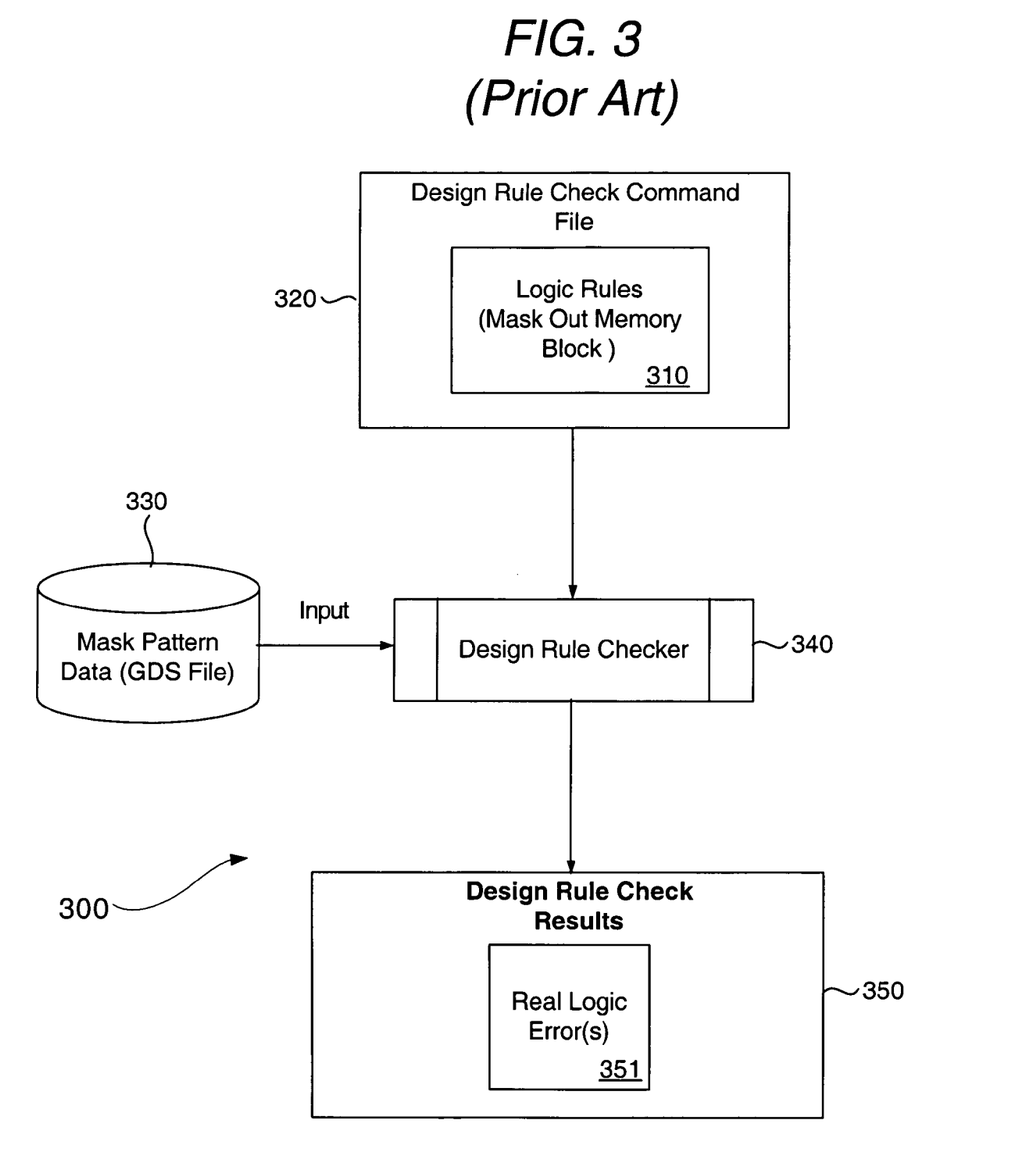
FIG. 3 illustrates a flow diagram of steps performed by a $2^{nd}$ prior art method for real Logic errors detection.

A second conventional method of checking design rules is described below with system 300 referenced in FIG. 3, where like numbers are intended to denote like structures and operations unless otherwise noted. In this approach, a Cell Delete or Masking technique 310 masks out the whole memory instance including memory bit cell arrays and other associated logic support circuitry such as wordline decoder, sense amplifier, etc. from design rule checks performed by checker 340 on GDS file 330. The design rule check (DRC) results 350 will thus consist only of real logic errors 351. However, this method assumes the memory blocks used are DRC clean and that the interfaces (or intermediate regions) between the memory and logic parts satisfy logic rules. Consequently, it will not detect any real errors in such features.

Accordingly, a substantial need exists in this field of art for an improved design verification tool that eliminates the aforementioned problems.

SUMMARY OF THE INVENTION

An object of the present invention, therefore, is to provide a design rule checking system and method that accurately reports appropriate errors for appropriate regions in a system that includes two different kinds of circuits, i.e., such as memory and logic.

A related object is to eliminate false errors caused by design rule checking tools examining regions that are not subject to the same design rules supported by the design rule-checking tool.

These objects are achieved by the present invention, which provides a system and method of checking design rules to determine whether or not a logic part (all non-memory devices that have to satisfy TLR) of a mask pattern data obeys logic rules (as specified in a TLR document) and the memory part of a mask pattern data obeys memory rules (in this case, logic rules that are modified appropriately for a memory area to accommodate the more liberal values available for such regions). This method helps users filter out false errors due to logic rule checks in a memory block, and further helps pinpoint real design rule errors in the mask pattern data.

Another aspect of the invention covers the creation of customized rules appropriate for different types of memory regions that might be included on a chip, where such customized rules are based on modifying a standard logic rule by "pushing" more liberal memory based parameter on to a stricter logic based parameter.

Yet another aspect of the invention pertains to a program that can be executed on any number of conventional computing systems for creating such customized rules, and/or for performing a design rule check on mask pattern data based on such customized rule sets.

Still another aspect of the invention concerns a system configured with the above mentioned customized design rules and programs executing on a conventional computer system.

In a preferred embodiment, the results are categorized in different categories in accordance with where they occur, such as in Logic, Bordered Single Port (BDSP) SRAM, Borderless Single Port (BLSP) SRAM, Dual Port (DP) SRAM and ROM groups. Furthermore it will more accurately detect and classify mistakes or any modifications made to standardized foundry bit cell designs as may be made by memory compiler vendors or layout engineers at the IC designer.

The present invention should find significant usage in the semiconductor industry and similar industries (for example, LCD) where different design rules must be applied to different types of regions on a substrate.

DETAILED DESCRIPTION

The present invention provides a solution to the disadvantages of the first and second conventional methods of checking design rules as explained above. From a broad perspective, the method generally applies the right set of rules to the right regions of the mask pattern data. To simplify the process (i.e., to avoid having to create an entire set of design rule checks from scratch, or to harmonize several different types of design rules from different memory cell vendors) and ensure its accuracy with respect to any particular set of foundry rules, the customized design rules are based on modifying a standard set of Logic Rules as needed to reflect needs of particular regions in the chip. Thus, a customized design rule is created for each different type of region that may be present on the chip, and this customized design rule is in fact simply based on pushing more liberal parameters onto stricter parameters contained in the standard Logic rules, and only in circumstances where it is necessary to do so. Accordingly, because different types of circuitry (logic, memory) may require different processing steps, lithographic constraints, etc., they can be treated independently by the present invention to ensure that design rules are accurately resolved for a system on chip integrated circuit design which uses a mix or blend of such circuitry. For instance, since memory circuits tend to be more aggressively sized and manufacturable than comparably sized and spaced logic designs, the former are subject to fewer layout constraints. These constraints include, among other things, minimum feature size, allowed feature shapes. (i.e., avoiding notches and similar undesirable shapes), minimum distances between different types of feature shapes, etc. For example, a gate width might be smaller in a memory design than a logic design, and the minimum spacing between two signal lines may be smaller as well. Allowable contact sizes and feature shapes may vary from region to region. Other examples will be apparent to those skilled in the art.

Figure 4:
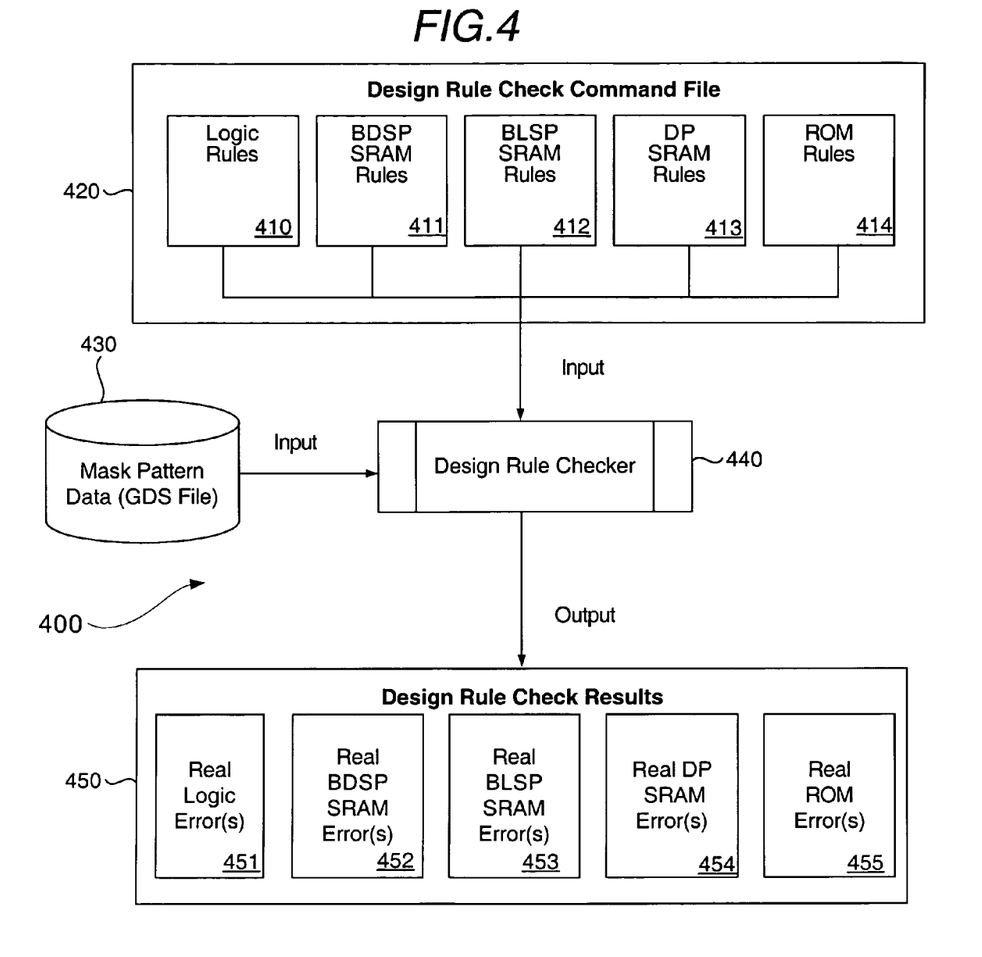
FIG. 4 illustrates a flow diagram of steps performed by a preferred embodiment of the present invention for Real Logic and Memory errors detection.

This system and method is described below with reference to FIG. 4. A system 400 includes a conventional computer system and various software routines and libraries for performing a design rule check as now explained. In particular, system 400 includes a standard logic design rule (for logic areas) 410 that is supplemented by additional customized logic rules 411-414 (for other types of areas such as specialized memory areas). One or more rules from this set are used to check a design in GDS form 430, depending on the types of regions presented in the IC. For example, if logic and (BDSP) SRAM were included in a design, both of these design rules would be used by design rule checker 440 (a software routine operating on the computer system) to check different areas of an IC layout as explained below. As seen in FIG. 4, each type of memory has its own set of customized rules to check against with. Note that in FIG. 4, "BDSP SRAM" stands for Bordered Single Port Static Random Access Memory; "BLSP SRAM" stands for Borderless Single Port Static Random Access Memory; "DP SRAM" stands for Dual Port Static Random Access Memory and "ROM" stands for Read Only Memory. The result is that a design rule check result 450 includes a number of separate error reports for layout violations detected in a layer (or layers) of an IC, including 451 (for real logic errors) 452 (for real BDSP SRAM errors) 453 (for real BLSP SRAM errors) 454 (for real DP SRAM errors) and 455 (for real ROM errors). Similar customized design rules could be created, of course, for embedded DRAM, flash, etc. The necessity for manual checking, and the possibility of so-called "false" errors, is substantially eliminated. This principle could be extended beyond just memories, of course, to include other design rules for other areas that have differing design rule requirements.

Figure 5:
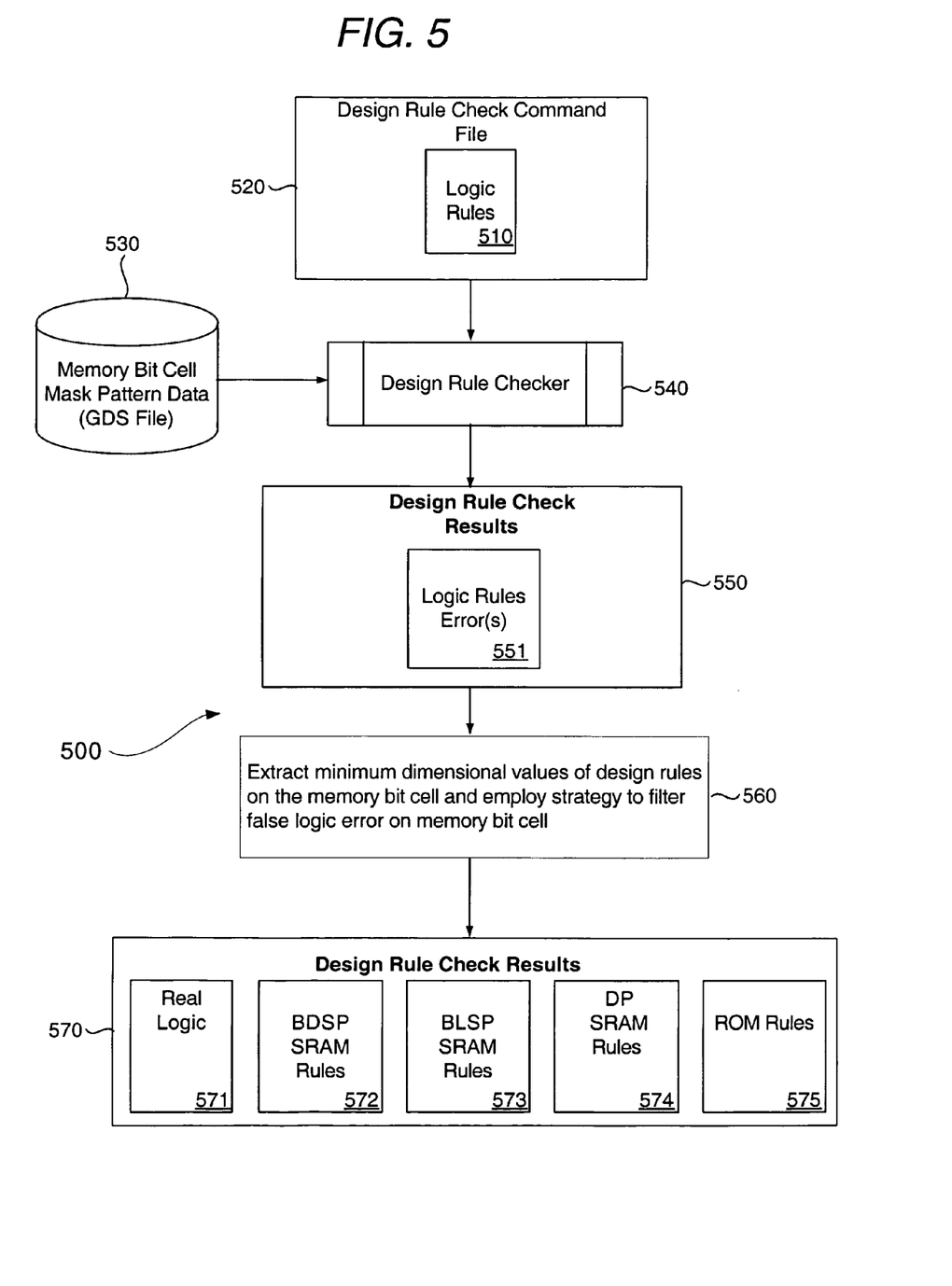
FIG. 5 illustrates a flow diagram of steps performed by [this] the preferred embodiment of the invention for creating customized design rule check command files based on modifying a standard logic rule file to take into consideration minimum dimensional values extracted from memory bit cell design parameters.
Figure 7A:
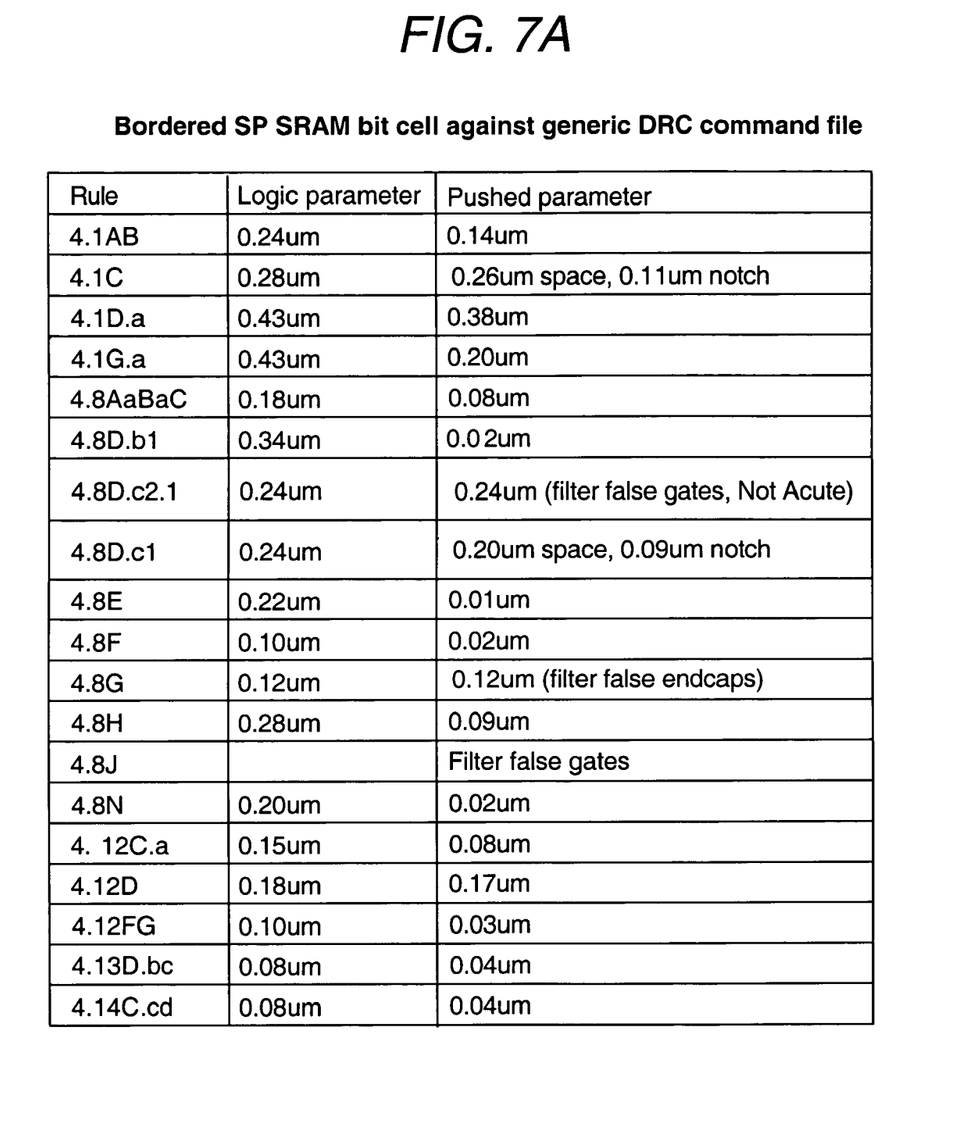
FIGS. 7A to 7C are examples of memory cell violations triggered by a standard logic rule against a variety of types of memory cells, and which violations are used to push appropriate minimum dimensional data onto a modified form of the logic rule to be used for designs utilizing such type of memory cell.
Figure 7B:
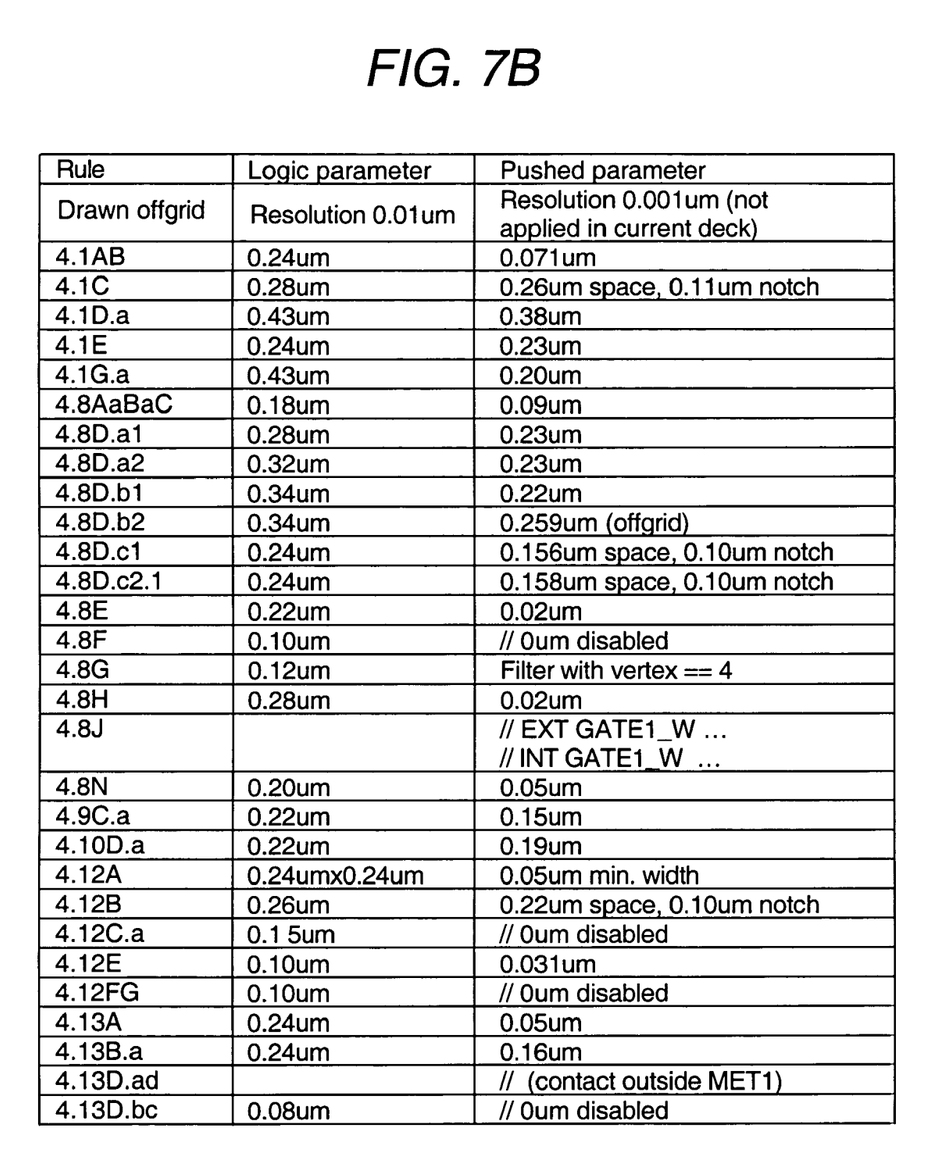
Figure 7C:
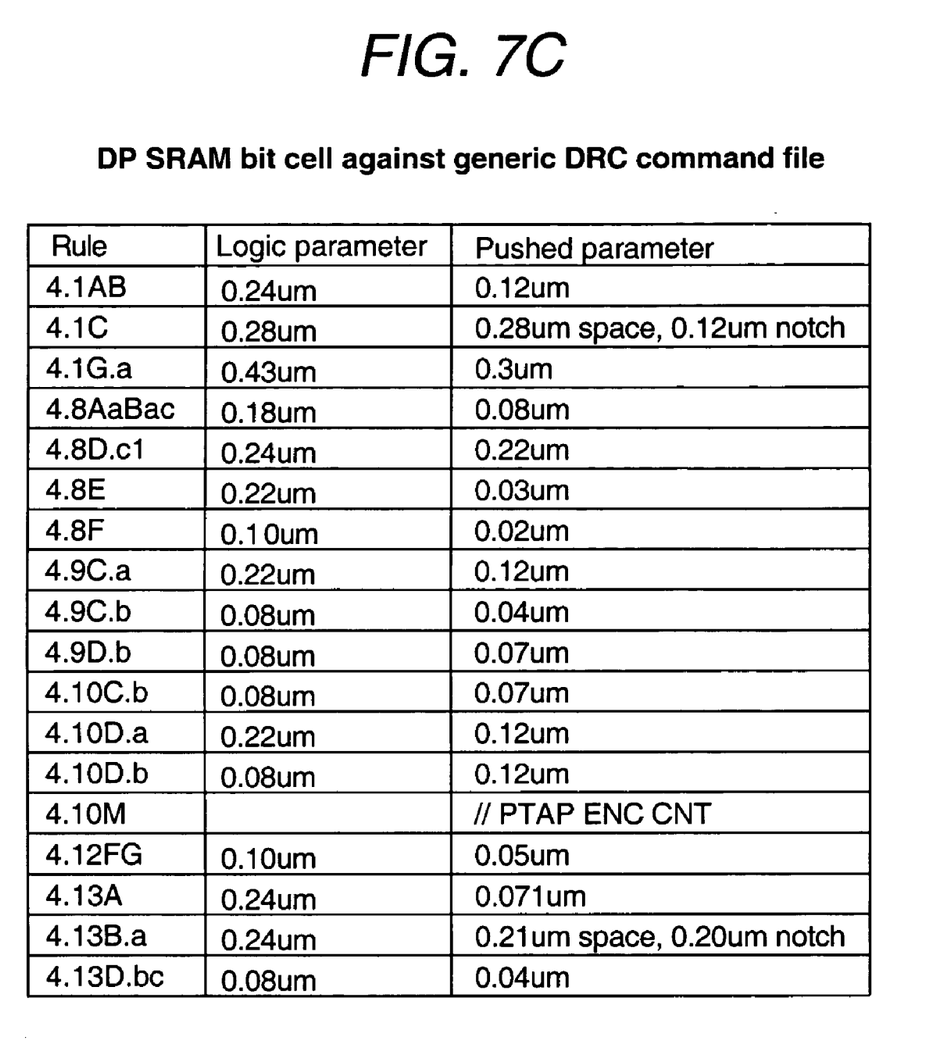

A system 500 which derives the customized memory rules from standard logic design rules is shown in FIG. 5. Note that the system 500 also can be any conventional computing system appropriately configured with the libraries, files and routines explained herein, and in fact, in a preferred embodiment, is the same system as system 400 noted earlier. The first step performed by system 500 is to run a design rule check with checker 540 on a memory bit cell mask pattern data 530 (from the appropriate memory type) against a design rule command file 520 that consists of only standard foundry logic rules 510. From this report 550—an example of which is shown in FIG. 7A for a BDSP SRAM—a list of violations is created at 551 as presented by the bit cells. In other words, the various features of the memory cell are checked against standard logic rules to determine where they will fail, and to generate a comprehensive list of all possible errors. These errors are analyzed to determine how the standard logic rules 510 should be modified for a customized design rule set for the particular memory cell for this vendor. Thus, an analysis of the actual memory design rules of such memory cell is made at step 560, and then the appropriate parameter (minimum dimension) is then "pushed" onto a modified form of the standard logic design rules to create a set of distinct and separate design rules 571-575 at step 570. Further examples are illustrated in FIGS. 7B and 7C for BLSP and DP SRAM cells in such memories for a 0.18 micron design as tested against the present assignee's own generic design rules as published as of the current date (version 2.2 p0). It is apparent that different violations would be presented by different logic and memory design rules, so that different types of parameters would be pushed as needed onto standard logic rules when creating customized design rules.

All these extracted values are used to derive customized memory rules (571-575) for each type of memories. Thus, this invention can be applied to any mask pattern database, including one having no memory blocks, or even multiple types of memory blocks. The only modification required to implement the present invention using conventional GDS formatted data is that different types of memory should be identified in some way, such as with different memory ID layers to defined core bit cell regions. This can be done in advance, by modifying the GDS data file directly, by adding a distinct memory ID layer on top of each type of memory to identify such different respective memory region types. Other techniques for identifying such layers will be apparent to those skilled in the art, and the present invention is by no means limited to any particular embodiment in this respect. The main goal is simply to ensure that design rule checker 540 is able to correlate a particular region in a layer with a particular set of design rules, and this can be accomplished in any number of ways either explicitly or implicitly.

Figure 6A:
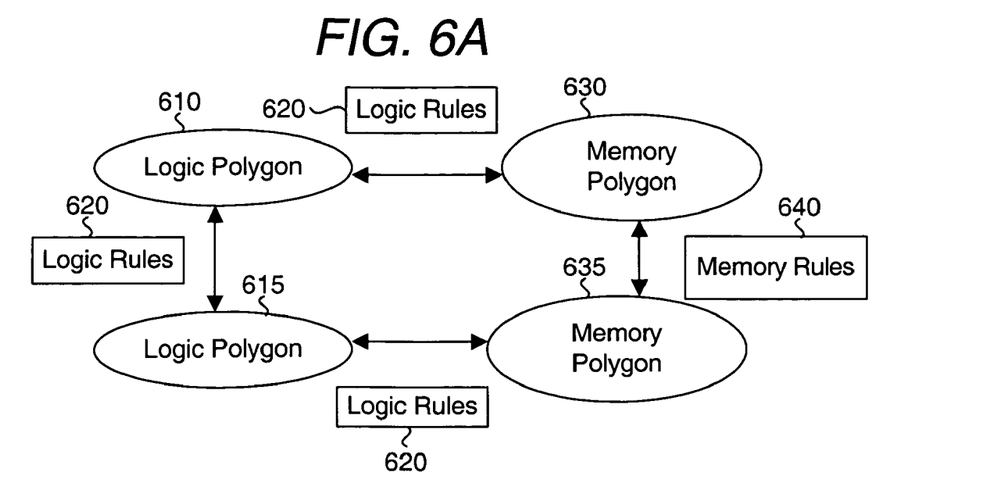
FIG. 6A illustrates the application of logic and memory rules within or between the logic and memory regions of a mask pattern data.
Figure 6B:
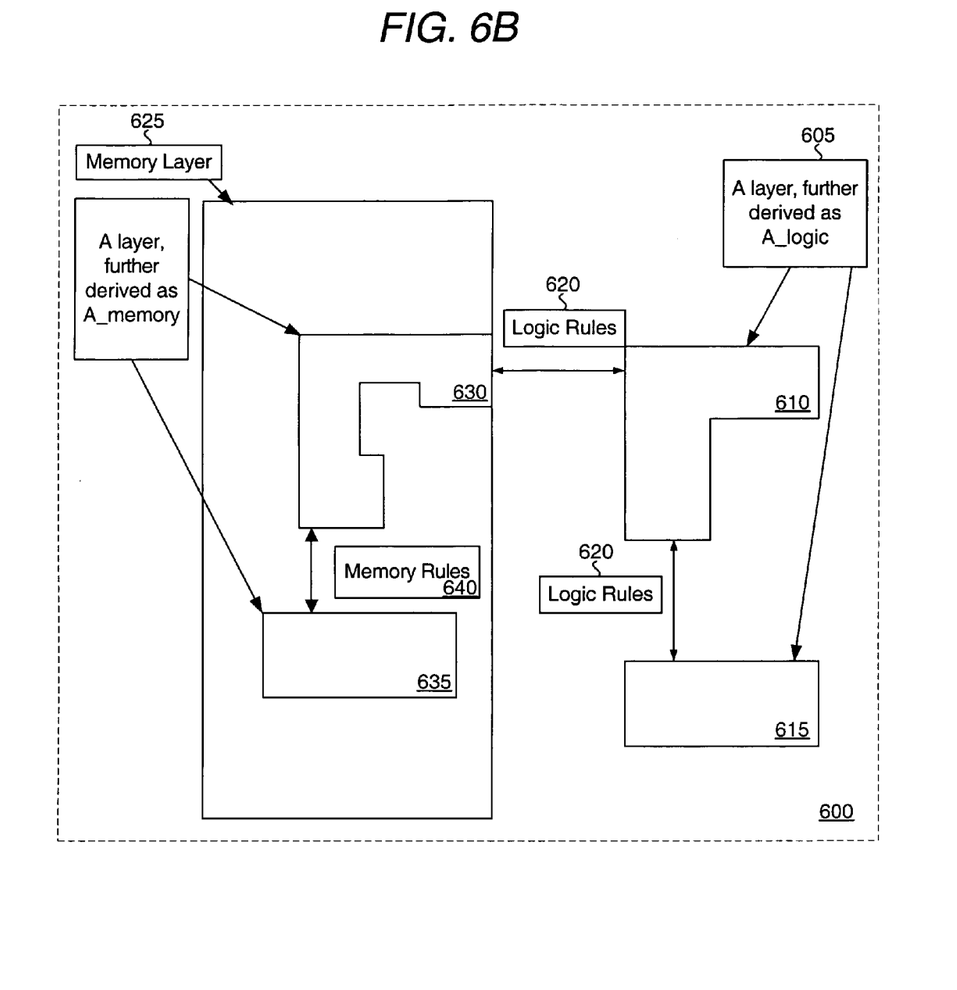
FIG. 6B illustrates the relationship of various circuitry regions in a layout of an IC, and how such are treated by the present invention.

FIGS. 6A and 6B illustrate the relationships of different polygons on a mask pattern data, and shows how different design rules are effectuated on a layer 600 within the chip layout. For polygons 610, 615 within a logic area 605, logic rules 620 should be applied. For polygons 630, 635 within a memory area 625, memory rules 640 should be applied. For a polygon 660 that is an intermediate area, i.e., extending from a logic area 605 to a polygon within a memory area 625, logic rules 620 are also applied in a preferred embodiment. This is because memory rules can only apply to polygons within the memory area due to different process impact. As suggested earlier, the conventional prior art methods do not and cannot distinguish between logic polygons and memory polygons within a layer. Therefore, the same set of rules is used to check against all polygons in a mask pattern data regardless of logic and memory regions, and this leads to improper results.

The manner in which the invention checks different regions with different design rules is shown in FIG. 6B as follows. First, in a particular layer A 600 of a layout, a polygon 605 in a logic area is derived as A_logic whereas a polygon 625 of layer A in a memory area is derived as A_memory. To satisfy a foundry's design rules for implementing a design into silicon, some minimum geometric constraints or dimensions must be observed; these include: a) Minimum A_logic to A_logic spacing defined as logic_value; b) Minimum A_memory to A_memory spacing defined as memory_value; and c) Minimum spacing between A_logic and A_memory is also defined as logic_value.

Accordingly, an appropriate standard logic design rile check is executed on region A_logic 605 using logic rules 571, and not on any other region. A_logic is derived as layer A NOT MEMORY). This yields any appropriate errors for this logic region of this layer, and is accurate for such region. Next, any memory regions 625 are treated (by examining their ID) in accordance with an appropriate memory region design rule (572-575). The A_memory layer is derived as (layer A AND layer MEMORY). This yields any appropriate errors for this memory region of this layer, and is accurate for such memory region. Any other memory regions are examined in the same way, with a design rule selected based on a particular memory ID.

It is apparent, of course, that the sequence is not critical, and that the steps could be reversed. It is only important that the appropriate region receive proper treatment in accordance with an appropriate design rule. All of the above processes can be performed in software with a conventional computer system as noted earlier that is adapted to execute the types of code described herein. Moreover, the aforementioned software routines/programs may be implemented using any number of well-known computer languages known to those skilled in the art in this area, and thus the invention is not limited in this regard.

Accordingly, the invention ensures that all types of memory regions have to fulfill all memory rules of their group. Correspondingly, all logic regions have to fulfill logic and memory rules (all logic regions that passed logic rules should have also passed memory rules since memory rules are looser compare to logic rules). The process is superior to prior art techniques in that it avoids false errors, and is more reliable, mote efficient, etc.

Thus, as noted FIG. 4, Mask Pattern Data 430 is fed into design rule checker 440 to check against both the logic and different memory rules as such may be needed. It is understood, of course, that in the case where an IC does not require mixed types of circuit types (i.e., logic and memory) that it may not be necessary to run both types of checks on each layer. The output of this process is a design rule check result file 450. The results consist of only real logic 451 and real memory errors 452. Thus, the present method divides layers of a mask pattern data into LOGIC, BDSP, BLSP; DP and ROM regions (or as many regions as there are different circuit types) so that the right sets of rules will only apply to the right regions. In this manner, false design rules are eliminated, and the implementation of circuit designs into silicon form is expedited as well.

Although the present invention has been described in terms of a preferred embodiment, it will be apparent to those skilled in the art that many alterations and modifications may be made to such embodiments without departing from the teachings of the present invention. In addition, many other industries, including liquid crystal display manufacturing and similar micro-patterned technologies, may benefit from the teachings herein. Accordingly, it is intended that the all such alterations and modifications be included within the scope and spirit of the invention as defined by the following claims.

What is claimed is:

1. In a computer readable medium storing a plurality of design rule check instructions, wherein the design rule check instructions being performed on a layout for an electronic circuit embodied on a substrate, the design rule check instructions comprising the steps of:
   (a) providing at least a first set of design rules for a first region of the layout within a first layer, including a first minimum spacing between first signal lines situated over the substrate;
   (b) providing at least a second set of design rules for a second region of the layout within the first layer including a second minimum spacing between second signal lines situated over the substrate; wherein said first region and said second region correspond to different types of circuitry to be embodied in the electronic circuit, and said first minimum spacing differs from said second minimum spacing;
   (c) processing a layer of the layout such that any said first region is checked in accordance with at least said first set of design rules, and said second region is checked in accordance with at least said second set of design rules; and
   generating said second set of design rules by modifying said first set of design rules in accordance with differences in sizings, spacings and/or tolerances manufacturable between said first region and said second region.

2. The design rule check instructions of claim 1, further including a step (d): generating a report of any errors detected in said first region and/or said second region.

3. The design rule check instructions of claim 1, wherein said electronic circuit is a liquid crystal display (LCD).

4. The design rule check instructions of claim 1, wherein said first region includes logic circuitry, and said second region includes one or more types of memory circuitry.

5. The design rule check instructions of claim 1, wherein said second set of design rules are derived by using said first set of design rules to check features of a memory based circuit so that any non-complying features can be identified, said non-complying features being features that do not comply with said first set of design rules.

6. The design rule check instructions of claim 5, further including a step: identifying a memory based design parameter value associated with the non-complying feature, and using said memory based design parameter value to alter a logic based design parameter value associated with the first set of design rules, so that said memory based design parameter value is used to create said second set of design rules.

7. The design rule check instructions of claim 1, further including a step: providing a third set of design rules for a third region used in the layout, which third region corresponds to a non-volatile memory.

8. The design rule check instructions of claim 1, wherein step (c) is performed within a computing system operating on a GDS formatted database tape containing the layout.

9. The design rule check instructions of claim 1, wherein a third region between said first region and said second region is also processed in accordance with said first set of design rules.

10. The design rule check instructions of claim 1, wherein said second region is identified in said layer through an identifier describing a type of memory implemented in said second region.

11. A method of verifying manufacturability of a Liquid Crystal Display (LCD) which includes a logic circuit portion situated in a first logic region and a memory circuit portion situated in a second memory region, the method comprising the steps of:
   (a) providing at least a first set of design rules for the first logic region, said first set of design rules specifying first minimum geometric constraints allowable for features in the first logic region; and
   (b) providing at least a second set of design rules for the second memory region, said second set of design rules specifying second minimum geometric constraints allowable for features in the second memory region; wherein at least some of said first minimum geometric constraints and said second minimum geometric constraints are different; and
   (c) identifying a first polygon present in a first layer of the LCD, including whether said first polygon corresponds to circuitry for a first logic region and/or a second memory region; and
   (d) when said first polygon corresponds to a first logic region, checking said first polygon for layout errors in accordance with at least said first set of design rules; and
   (e) when said first polygon corresponds to a second memory region, checking said second memory region for layout errors in accordance with at least said second set of design rules; and
   (f) generating an output indicative of any errors detected in a physical layout of the LCD, including in the first logic region and the second memory region; wherein all of steps (a) through (f) are performed by one or more program routines executing on a computing system.

12. The method of claim 11, wherein said first minimum geometric constraints and said second minimum geometric constraints include one or more of the following: (a) minimum spacings between signal lines; and/or (b) minimum line widths; and/or (c) minimum gate widths.

13. The method of claim 11, wherein said first layer includes at least two different types of circuitry, including at least one for said first logic region, and at least one for said second memory region.

14. The method of claim 11, further including a step of providing at least a third set of design rules for an intermediate region located between said first logic region and said second memory region.

15. The method of claim 11, further including a step of providing at least a third set of design rules for a third memory region, said third memory region containing a memory circuit with different characteristics than a memory circuit in said second memory region.

16. The method of claim 15, wherein said third memory region is a read-only-memory (ROM), and said second memory region is an Static Random Access Memory (SRAM).

17. In a computer readable medium storing a plurality of design rule check instructions, the design rule check instructions being generated for a plurality of different circuit regions to be used on a system-on-chip (SOC) integrated circuit (IC), the design rule check instructions comprising the steps of:

(a) providing at least a first set of design rules for a first type of circuit region within a first layer, said first set of design rules specifying first minimum geometric constraints allowable for features in the first type of circuit region including a first minimum gate width; and (b) generating a second set of design rules for a second type of circuit region within a first layer based on said first set of design rules, said second set of design rules specifying second minimum geometric constraints allowable for features in the second memory region including a second minimum gate width; wherein at least some of said first minimum geometric constraints and said second minimum geometric constraints are different within the first layer, including said first minimum gate width and said second minimum gate width; and further wherein said first set of design rules and said second set of design rules are in a form suitable for use by a design rule checking software application; and wherein step (b) includes the following steps:

(b1) checking geometric features of said second type of circuit region against said first set of design rules;

(b2) identifying any errors triggered by said geometric features of said second type of circuit region, said errors corresponding to instances where said geometric figures do not comply with said first set of design rules; and (b3) modifying at least some of said first minimum geometric constraints in said first set of design rules in response to any errors identified in step (b2); wherein said second set of design rules is derived from some of said first minimum geometric constraints and others of said first minimum geometric constraints that have been modified to accommodate characteristics of said geometric features as they may be found in said second type of circuit region.

18. The design rule check instructions of claim 17, wherein steps (b1) to (b3) are repeated to generate a third set of design rules for a third type of circuit region.

19. In a computer readable medium for performing a design rule check on mask pattern data for an integrated circuit (IC) based on a first set of design rules and a separate second set of design rules, wherein said computer readable medium stores a computer program and upon executing said computer program, the improvement comprising:

a step for processing multiple mask pattern data of the layout in accordance with said first set of design rules and/or said second set of design rules to check each region of said multiple mask pattern data for potential layout errors;

wherein each region in each of said multiple mask pattern data is identified at least as a first type of region or a second type of region to be fabricated within a set of one or more mask pattern data of said multiple mask pattern data on a substrate; and further wherein said step checks said region across each mask pattern data in said set of one or more mask pattern data in accordance with at least said first set of design rules when it is identified as said first type of region, and said step checks said region in accordance with at least said second type of design rules when it is identified as said second type of region;

wherein different regions within a particular mask pattern data is checked within different design rules.

20. A system for performing a design rule check on a layout for an electronic circuit on a substrate comprising:

(a) a computer system adapted for executing one or more program routines;

(b) a first set of design rules specifying layout rules for a first region of the layout within a mask pattern data including a first minimum spacing between first signal lines situated over the substrate, (c) a second set of design rules specifying layout rules for a second region of the layout within said mask pattern data including a second minimum spacing between second signal lines situated over the substrate; wherein said first region and said second region correspond to different types of circuitry to be embodied in the electronic circuit within the mask pattern data, and said first set of design rules and said second set of design rules are formatted in electronic form suitable for use by said computer system;

(d) a first program routine executing on the computer system and adapted for processing a mask pattern data of the layout in accordance with said first set of design rules and/or said second set of design rules;

wherein when said first region is within said mask pattern data, it is checked in accordance with at least said first set of design rules, and when said second region is within said mask pattern data, said second region is checked in accordance with at least said second set of design rules;

wherein said first minimum spacing differs from said second minimum spacing and is based on a manufacturing rule specified by a foundry manufacturer to be used for making the electronic circuit on the substrate.

21. The system of claim 20, wherein an error list is generated of any errors detected in said mask pattern data.

22. The system of claim 20, wherein said first region corresponds to a logic portion of the electronic circuit, and said second region includes one or more different types of memory circuits of the electronic circuit.

* * * * *